United States Patent
Miyagaki et al.

(10) Patent No.: US 6,188,090 B1
(45) Date of Patent: Feb. 13, 2001

(54) SEMICONDUCTOR DEVICE HAVING A HETEROEPITAXIAL SUBSTRATE

(75) Inventors: Shinji Miyagaki; Takashi Eshita; Satoshi Ohkubo; Kazuaki Takai, all of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/026,915

(22) Filed: Feb. 20, 1998

Related U.S. Application Data

(60) Division of application No. 08/619,249, filed on Mar. 21, 1996, now Pat. No. 5,834,362, which is a continuation-in-part of application No. 08/520,939, filed on Aug. 31, 1995, now abandoned.

(51) Int. Cl.[7] .................. H01L 31/0328; H01L 31/0336; H01L 31/072; H01L 31/109
(52) U.S. Cl. ............................................................ 257/200
(58) Field of Search .................................... 257/200, 183

(56) References Cited

U.S. PATENT DOCUMENTS

| | | | |
|---|---|---|---|
| 4,050,964 | * 9/1977 | Rode | 117/55 |
| 4,773,355 | 9/1988 | Rief et al. | 118/725 |
| 5,252,173 | 10/1993 | Inoue | 156/610 |
| 5,256,594 | 10/1993 | Wu et al. | 437/89 |
| 5,391,515 | 2/1995 | Kao et al. | 437/133 |
| 5,399,522 | * 3/1995 | Ohori | 438/493 |
| 5,402,748 | * 4/1995 | Takai et al. | 117/84 |
| 5,492,860 | 2/1996 | Ohkubo et al. | 437/133 |
| 5,569,953 | 10/1996 | Kikkawa et al. | 257/607 |
| 5,668,402 | * 9/1997 | Mochizuki et al. | 257/627 |
| 5,844,303 | * 12/1998 | Kikkawa et al. | 257/609 |
| 5,844,360 | * 12/1998 | Ohori | 257/190 |

FOREIGN PATENT DOCUMENTS

| | | |
|---|---|---|
| 63-053914 | 3/1988 | (JP) . |
| 63-184320 | 7/1988 | (JP) . |
| 06-045249 | 2/1994 | (JP) . |

* cited by examiner

Primary Examiner—Brian Dutton
(74) Attorney, Agent, or Firm—Staas & Halsey LLP

(57) ABSTRACT

A method for fabricating a compound semiconductor device includes the steps of depositing a first group III–V compound semiconductor layer on a surface of a Si substrate while holding a temperature of the Si substrate at a first temperature, depositing a second group III–V compound semiconductor layer on the first group III–V compound semiconductor layer while holding the temperature of the substrate at a second, higher temperature, and depositing a third group III–V compound semiconductor layer on the second group III–V compound semiconductor layer while holding the temperature of the substrate at a third temperature higher than said second temperature, wherein the second group III–V compound semiconductor layer contains Al.

12 Claims, 11 Drawing Sheets

SEMICONDUCTOR DEVICE HAVING A HETEROEPITAXIAL SUBSTRATE

CROSS-REFERENCE TO RELATED APPLICATIONS

This application is a Divisional of U.S. application Ser. No. 08/619,249 filed Mar. 21, 1996 now U.S. Pat. No. 5,834,362 which is a Continuation-in-Part of U.S. application Ser. No. 08/520,939 filed Aug. 31, 1995, now abandoned.

BACKGROUND OF THE INVENTION

The present invention generally relates to semiconductor devices and more particularly to a semiconductor device having a heteroepitaxial substrate as well as a fabrication process thereof.

Group III–V compound semiconductor materials generally have a characteristic band structure that facilitates high speed electron transfer because of large electron mobility pertinent to such semiconductor materials. Thus, Group III–V compound semiconductor materials are used extensively for high speed semiconductor devices such as MESFET, HEMT or HBT. Further, some of the group III–V compound semiconductor materials have a band structure that allows direct transition of carriers. Thus, the group III–V compound semiconductor materials are used also for optical semiconductor devices.

Generally, such a compound semiconductor device is formed on a wafer of a compound semiconductor material sliced from a single crystal ingot of the compound semiconductor material or on an epitaxial layer of the compound semiconductor material grown on a Si wafer. The former approach generally has a problem of increased cost due to the difficulty of growing a large diameter crystal ingot. Further, such a compound semiconductor wafer is heavy and brittle, and handling of such a wafer is substantially difficult as compared with the case of handling a Si wafer. This problem becomes particularly acute when forming semiconductor devices on a large diameter wafer.

The latter approach, on the other hand, is advantageous in the point that one can use a light and strong Si wafer that is produced by a well established process. As long as Si is used, a large diameter wafer is readily available at low cost. Thus, there are intensive studies for decreasing the fabrication cost of compound semiconductor devices by forming the devices on a layer of a compound semiconductor material grown epitaxially on a Si wafer.

Meanwhile, it is well known that there exists a large discrepancy between Si and a compound semiconductor crystal such as GaAs in terms of lattice constant and thermal expansion coefficient. As a result, one encounters various difficulties when growing a layer of a compound semiconductor material epitaxially on a Si wafer. It should be noted that there exists a discrepancy of about 4% in the lattice constant between Si and GaAs. Further, the thermal expansion coefficient of GaAs is about twice as large as that of Si. Thus, mere deposition of GaAs on a Si wafer does not provide a high quality GaAs layer suitable for the active layer of semiconductor devices.

In order to eliminate this problem and to grow a single crystal layer of a group III–V compound material upon a Si substrate with high quality, there is a proposal, as disclosed in the Japanese Laid-open Patent Publication 59-19762, to deposit a first GaAs layer on a Si substrate with a temperature of 400–500° C., which is lower than the deposition temperature commonly used for GaAs, followed by an ordinary epitaxial deposition process of a second GaAs layer at a commonly used deposition temperature of about 700° C. According to such a process, the first GaAs layer is deposited on the Si substrate with a state somewhat close to amorphous phase, wherein the first GaAs layer crystallizes subsequently upon deposition of the second GaAs layer at the temperature of about 700° C. Thereby, the foregoing first and second GaAs layers collectively form a single crystal GaAs layer grown epitaxially on the Si substrate.

Further, Japanese Laid-open Patent Publication 1-290220 describes a similar process that further includes a step of depositing another, additional GaAs layer between the step of forming the first GaAs layer and the step of forming the second GaAs layer, wherein the step of depositing the additional GaAs layer is conducted at a temperature in the range of 550–600° C. By providing the additional GaAs layer between the first and second GaAs layers, it is possible to reduce the defect density of the GaAs epitaxial layer thus formed.

However, such conventional two-step or three-step processes generally cause a problem in that undulation occurs on the surface of the heteroepitaxial layer grown on the Si substrate. Such an undulation is attributed to the formation of an island structure as a result of three-dimensional growth of the compound semiconductor crystal layer, rather than the desired, two-dimensional growth. Once formed, such an undulation on the heteroepitaxial substrate is transferred to the active layer of the semiconductor device that is formed on the heteroepitaxial substrate, and the operational characteristics of the semiconductor device is deteriorated seriously. In high speed devices such as HEMT that operates based upon the principle of high speed transfer of electrons in a two-dimensional electron gas, such an undulation of the active layer results in various unwanted effects such as carrier scattering.

Further, conventional heteroepitaxial substrates tend to show a problem of relatively low sheet resistance, in the order of 300–400/□. Thus, such a conventional heteroepitaxial substrate suffers from the problem of inferior device isolation when used for carrying integrated circuits thereon. It is believed that such a decrease of the sheet resistance occurs at the time of a preheating process that includes an annealing process conducted in an arsine ($AsH_3$) atmosphere, wherein such a preheating process is conducted for removing an oxide film from the surface of the Si substrate.

More specifically, As atoms in the arsine atmosphere cause a diffusion into the Si substrate as a result of the thermal annealing process conducted at a high temperature of typically about 1000° C. The As atoms thus reached the Si substrate thereby cause a doping of the Si substrate to the n-type. In order to avoid such a problem of unwanted As doping of the Si substrate, it is conventionally proposed to conduct the preheating process in the $H_2$ atmosphere rather than in the arsine atmosphere. However, such a process improves the sheet resistance only very little. Even according to such a process, the sheet resistance increases at best to the order of 600–700 Ω/□. The reason for this is believed to be that the compound semiconductor layer contains dislocations with very high density at the part thereof located in the vicinity of the interface to the Si substrate, and Si atoms in the Si substrate cause a diffusion into the compound semiconductor layer on the substrate along such dislocations. As a result, the compound semiconductor layer inevitably experiences doping, and the heteroepitaxial substrate cannot provide a sufficient device isolation.

SUMMARY OF THE INVENTION

Accordingly, it is a general object of the present invention to provide a novel and useful heteroepitaxial substrate as well as a semiconductor device formed thereon, wherein the foregoing problems are eliminated.

Another and more specific object of the present invention is to provide a process for producing a heteroepitaxial substrate that effectively suppresses the three-dimensional growth of a group III–V compound semiconductor layer on a Si substrate, as well as a semiconductor device formed on such a heteroepitaxial substrate.

Another object of the present invention is to provide a method for fabricating a compound semiconductor device, comprising the steps of:

depositing a first group III–V compound semiconductor layer on a surface of a Si substrate while holding a temperature of said Si substrate at a first temperature;

depositing a second group III–V compound semiconductor layer on said first group III–V compound semiconductor layer while holding the temperature of said Si substrate at a second, higher temperature, said second group III–V compound semiconductor layer containing Al; and depositing a third group III–V compound semiconductor layer on said second group III–V compound semiconductor layer while holding the temperature of said Si substrate at a third temperature higher than said second temperature.

Another object of the present invention is to provide a compound semiconductor device, comprising:

a Si substrate;

a first group III–V compound semiconductor layer provided on said Si substrate, said first group III–V compound semiconductor layer having a thickness set to enable a direct deposition of the first group III–V compound semiconductor layer on a surface of said Si substrate;

a second group III–V compound semiconductor layer provided on said first group III–V compound semiconductor layer, said second group III–V compound semiconductor layer containing Al and having a thickness that minimizes a surface roughness thereof;

a third group III–V compound semiconductor layer provided on said second group III–V compound semiconductor layer provided on said second group III–V compound semiconductor layer;

a forth group III–V compound semiconductor layer provided on said third group III–V compound semiconductor layer; and an active device formed on said fourth group III–V compound semiconductor layer.

According to the present invention, one can suppress the three-dimensional growth of the second group III–V compound semiconductor layer by incorporating Al therein. Thereby, the desired two-dimensional growth of semiconductor layer is facilitated not only in the second group III–V compound semiconductor layer but also in the third and fourth group III–V compound semiconductor layers, and the problem of degradation of the operational performance of the active device is successfully avoided. As it is possible to use a low cost, large diameter Si wafer for the Si substrate, the fabrication cost of the compound semiconductor device is substantially reduced.

Further, the present invention achieves a high sheet resistance for the heteroepitaxial substrate by using a material containing Al for the second group III–V compound semiconductor layer. By incorporating Al, which is a reactive element, oxygen is incorporated also into the group III–V compound semiconductor layers, and such oxygen incorporated into the group III–V compound semiconductor layers increases the resistance of the group III–V compound semiconductor layers by causing a depletion of carriers therein.

The present invention further increases the sheet resistance of the heteroepitaxial substrate by controlling the density of oxidation-induced stacking faults (OSF) existing in the Si substrate. By reducing the OSF density, it is possible to minimize the diffusion of the group V elements occurring from the group III–V compound semiconductor layers to the Si substrate. Thereby, the problem of unwanted doping of the Si substrate by the group V elements thus diffused from the group III–V compound semiconductor layers is substantially suppressed.

The present invention further increases the sheet resistance of the heteroepitaxial substrate by employing a material that contains Sb for the group V element but is substantially free from As or P, for the first group III–V compound semiconductor layer. As Sb shows very little solubility in Si, no substantial diffusion of Sb occurs from the first group III–V compound semiconductor layer to the Si substrate, and the first group III–V compound semiconductor layer thus containing Sb acts thereby as a barrier for blocking the diffusion of the group V elements from the second or third group III–V compound semiconductor layer into the Si substrate.

Other objects and further features of the present invention will become apparent from the following detailed description when read in conjunction with the attached drawings.

DETAILED DESCRIPTION OF THE PREFERRED EMBODIMENTS

First, description will be made briefly upon the deposition apparatus used in the present invention for depositing epitaxial layers.

Figure 1:
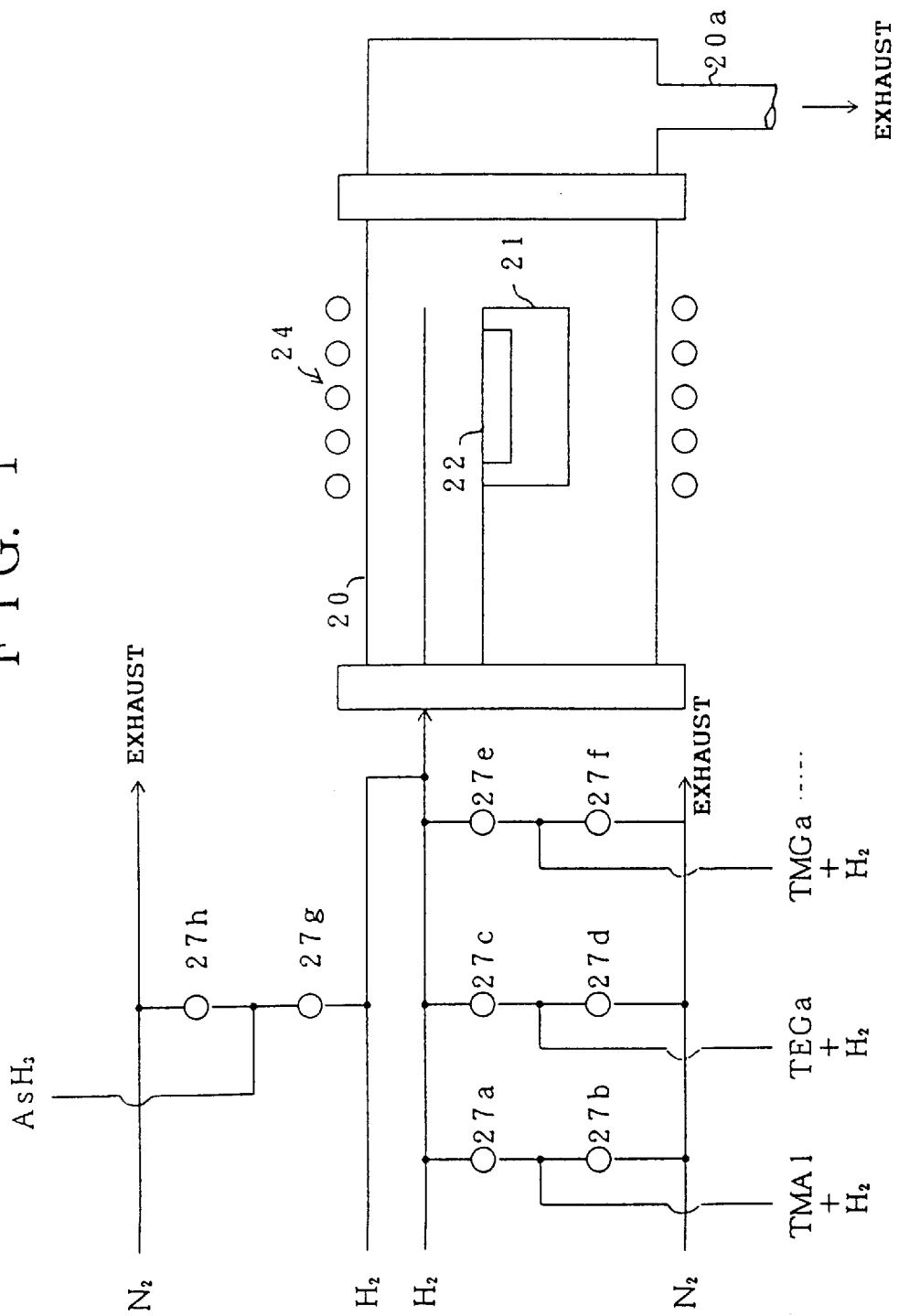
FIG. 1 is a diagram showing the construction of an MOCVD apparatus used in the present invention for depositing epitaxial layers.

Referring to FIG. 1, the deposition apparatus includes a horizontal type reactor 20 evacuated at an outlet port 20a, wherein the reactor 20 includes a susceptor 21 of carbon (C) for supporting thereon a substrate 22. Further, an RF coil 24 is provided around the reactor 20 for energizing the susceptor 21, such that the substrate 22 on the susceptor 21 experiences heating upon energization of the RF coil 24.

In operation, the reactor 20 is supplied with trimethylaluminum (TMA), via a valve 27a, together with a carrier gas of H$_2$, as a source of Al. Further, arsine is supplied to the reactor 20 via a valve 27g as a source of As. Similarly, supply lines of trimethylgallium (TMG) and triethylgallium (TEG) are connected to the reactor 20 via respective valves 27e and 27c. Further, a carrier gas of H$_2$ is supplied to the reactor 20. As usual, a controller (not illustrated) is provided for controlling the valves 27a–27h and for controlling the energization of the RF coil 24. In addition, valves 27b, 27d, 27f and 27h are provided for exhausting source gases with N$_2$.

Hereinafter, the process for producing a heteroepitaxial substrate according to a first embodiment of the present invention will be described with reference to FIG. 2.

In the present embodiment, an (100)-oriented substrate of Si having a principal surface inclined in the (011)-direction with respect to the (100) surface with an offset angle of 2°, is held on the susceptor 21, and the carrier gas of H$_2$ is introduced to the reactor 20 with a flowrate of 10–15 SLM, typically with a flowrate of 12 SLM. While introducing the carrier gas, the reactor 20 is evacuated at the outlet port 20a such that the internal pressure of the reactor 20 is held at 76 Torr, and a preheating process is conducted at a temperature of 900–1100° C., typically at 1000° C., for 10–30 minutes by energizing the RF coil 24. As a result of the pre-heating process, any oxide film is removed from the Si substrate 22.

Next, while maintaining the pressure inside the reactor 20 at 76 Torr, the temperature of the substrate 22 is reduced to 300–400° C., typically to 350° C., and the foregoing source gases are introduced into the reactor 20. More specifically, the source gases of TMA, TEG and arsine are introduced with respective flowrates of 2–3 SCCM, 2–4 SCCM and 120–160 SCCM, typically with respective flowrates of 2.5 SCCM, 3 SCCM and 140 SCCM. As a result, a first layer 22a of AlGaAs is grown on the Si substrate 22 as indicated in FIG. 2 with a thickness of 10–20 nm, typically with a thickness of 15 nm. The layer 22a thus obtained may have a composition of Al$_{0.2}$Ga$_{0.8}$As and shows an excellent flat surface due the composition that contains Al and due to the very small layer thickness. As the layer 22a is very thin, one may replace the layer 22a by a thin layer of GaAs.

Next, the supply of TMA and TEG is interrupted and the substrate temperature is raised to 500–600° C., typically to 550° C., while holding the pressure inside the reactor at 76 Torr. After the substrate temperature has reached a desired predetermined temperature level, the supply of TMA and TEG is resumed to form a second layer 22b of AlGaAs on the first layer 22a with a thickness of 200–700 nm, typically with a thickness of 500 nm. In this process, TMA, TEG and arsine are supplied with respective flowrates of 0.2–0.3 SCCM, 0.8–1.2 SCCM and 50–70 SCCM. Typically, TMA and TEG are supplied with respective flowrates of 0.25 SCCM and 1.0 SCCM. The layer 22b thus formed typically has a composition of Al$_{0.2}$Ga$_{0.8}$As.

Conventionally, the second layer 22b thus formed generally shows a rough crystal surface, while the present invention successfully suppresses the formation of rough surface on the layer 22b by incorporating Al into the layer 22b as will be explained in detail later. Further, the process of interrupting the supply of TMA and TEG during the process of raising the substrate temperature prior to the deposition of the layer 22b, also contributes to the effect of suppressing the formation of rough surface on the layer 22b.

After the formation of the AlGaAs layer 22b as such, the substrate temperature is raised to 650–750° C., typically to 700° C., while holding the pressure inside the reactor at 76 Torr. Further, the source of Ga is switched from TEG to TMG and a layer 22c of GaAs is grown on the AlGaAs layer 22b with a thickness of 0.5–1.5 μm, typically with a thickness of 1.0 μm. During the process of growing the GaAs layer 22c, TMG and arsine are supplied with respective flowrates of 2.0–3.0 SCCM and 30–40 SCCM. Typically, the supply of TMG is made with a flowrate of 2.5 SCCM. In order to suppress the dislocation density on the surface of the layer 22c to a level of $10^8$ cm$^{-2}$ or less as is required for a semiconductor substrate and to prevent cracking of the heteroepitaxial layer, it is preferable to set the overall thickness of the heteroepitaxial layer including the layers 22a–22c to fall in a range of 1–2 μm, typically 1.5 μm.

Figure 3A:
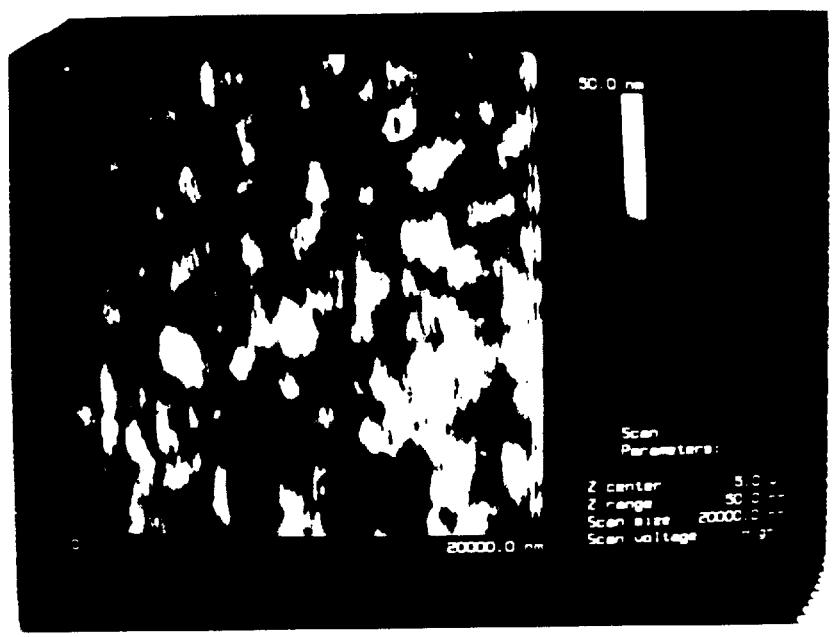
FIGS. 3A and 3B are photographs showing the surface of the heteroepitaxial substrate according to the present invention (i.e., FIG. 3B) in comparison with a conventional heteroepitaxial substrate (i.e., FIG. 3A)
Figure 3B:

FIGS. 3A and 3B show the result of an AFM (atomic force microscope) observation on the surface state of the layer 22c formed according to the foregoing process, in comparison with a conventional case in which the same heteroepitaxial substrate is formed except that the layer 22b does not contain Al. It should be noted that FIG. 3A represents the conventional heteroepitaxial substrate while FIG. 3B shows the heteroepitaxial substrate of the present embodiment.

Referring to FIGS. 3A and 3B, the bright regions indicate projections while dark regions indicate depressions. Thus, it will be noted that the area of the bright regions is reduced substantially in the heteroepitaxial substrate of the present embodiment as compared with the conventional heteroepitaxial substrate, indicating that the surface roughness of the layer 22c is reduced substantially in the present embodiment shown in FIG. 3B. In fact, the heteroepitaxial substrate of FIG. 3A shows a root mean square of surface roughness of 3.0 nm for an area of 50 μm×50 μm, while the heteroepitaxial substrate of FIG. 3B shows a root mean square of surface roughness of 2.4 nm for the same area.

Figure 2:
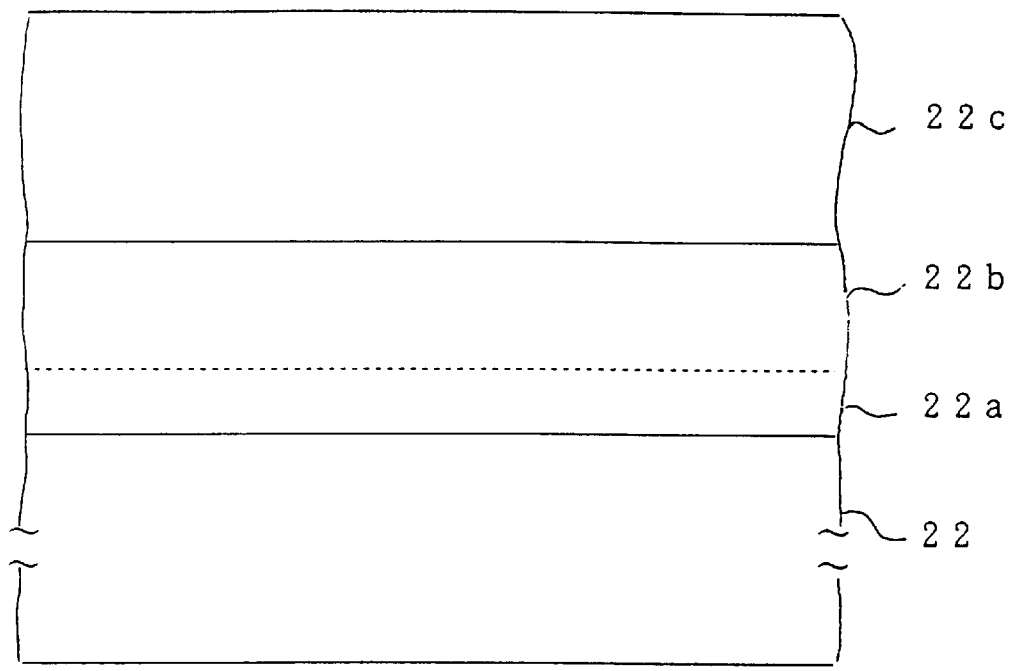
FIG. 2 is a diagram showing the construction of a heteroepitaxial substrate according to first and second embodiments of the present invention.
Figure 4:
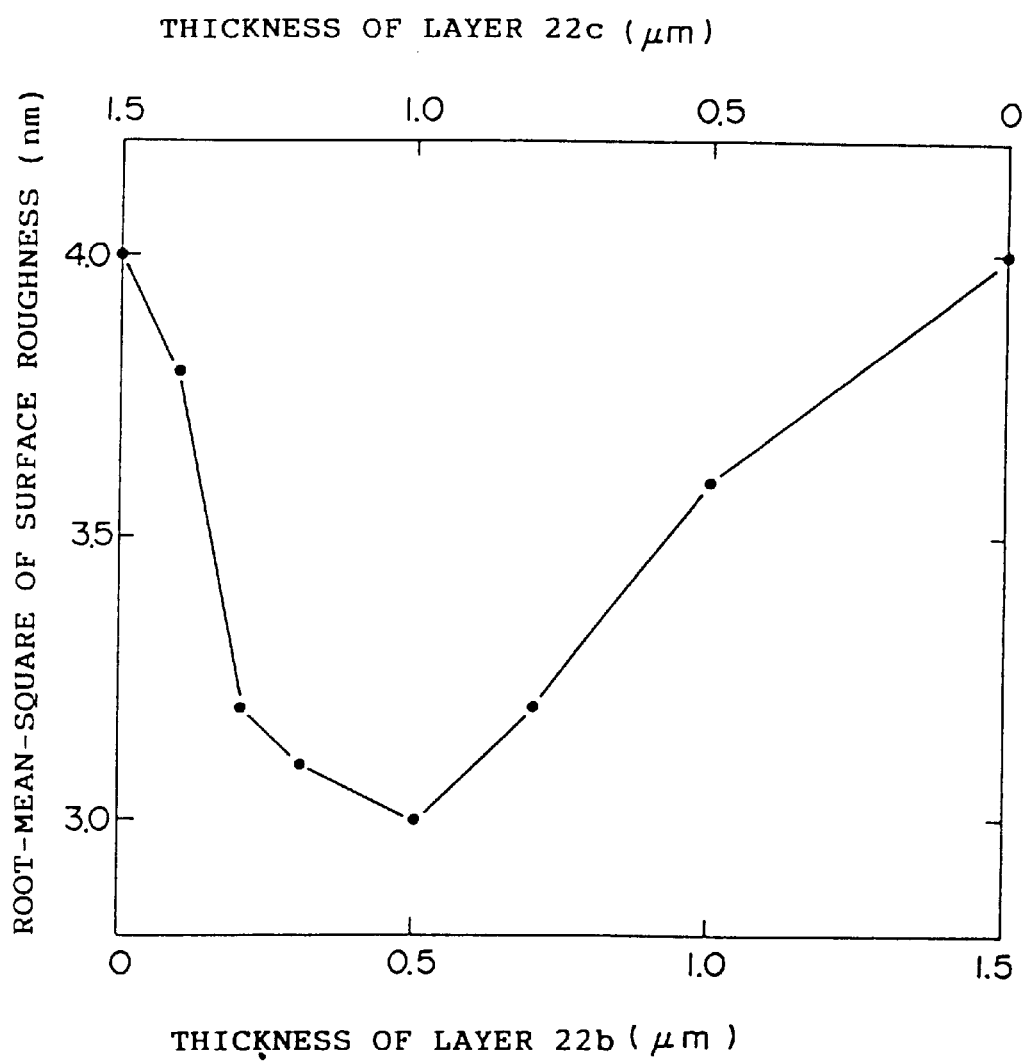
FIG. 4 is a diagram showing the relationship between the root mean-square of surface roughness and the thickness of a semiconductor layer forming a part of the heteroepitaxial substrate.

FIG. 4 shows the root mean square of surface roughness of the heteroepitaxial substrate shown in FIG. 2 for various thicknesses of the layer 22b while holding the total thickness of the layers 22b and 22c at 1.5 μm. It should be noted that the result of FIG. 4 is obtained for the case in which the layer 22b does not contain Al. However, the relationship of FIG. 4 is applicable also to the case in which the layer 22b contains Al.

Referring to FIG. 4, it will be noted that the root mean square of surface roughness decreases with increasing thickness of the layer 22b and reaches a minimum at the thickness of 500 nm for the layer 22b. With a further increase in the thickness of the layer 22b, the root mean square of surface roughness increases again. As the example of FIG. 4 is for the case in which the layer 22b does not contain Al, the minimum surface roughness reached for the layer 22c is about 3 nm. By incorporating Al into the layer 22b, however, one can reduce the root mean square surface roughness of the layer 22c further to about 2.4 nm as explained already.

Figure 5:
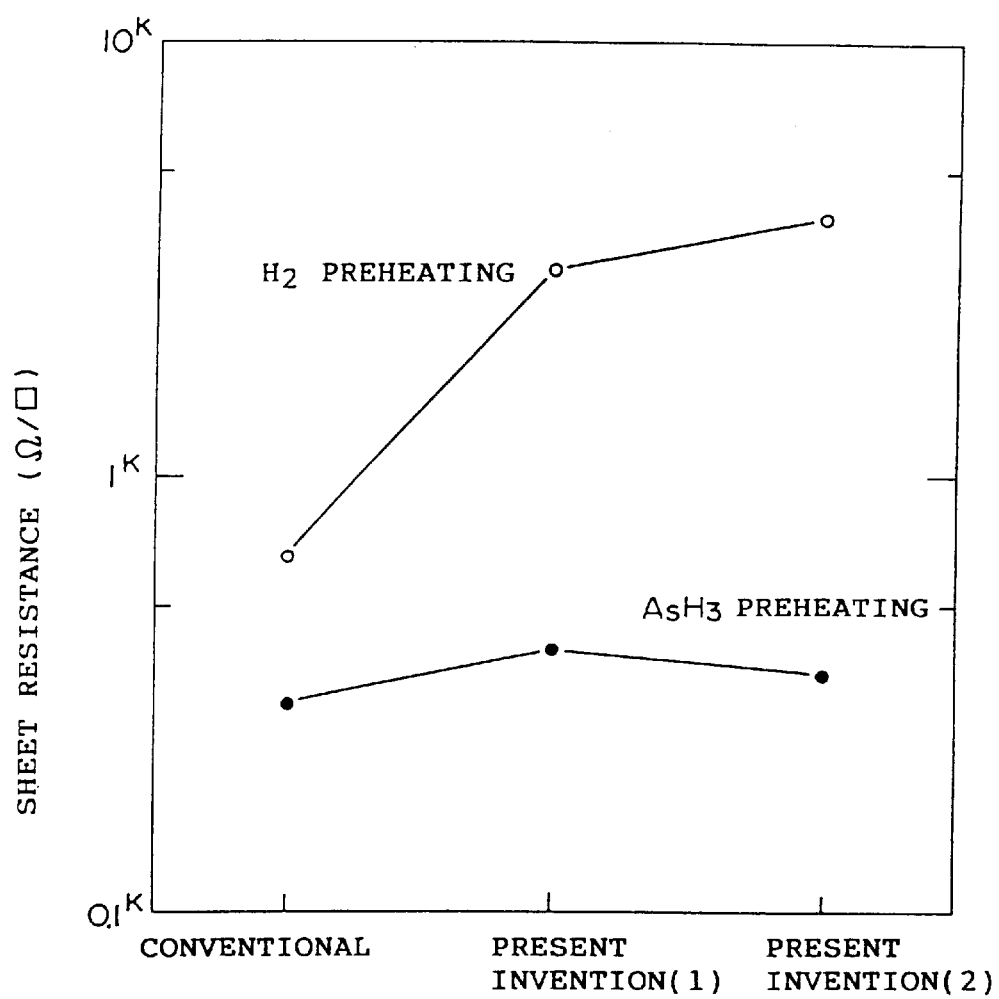
FIG. 5 is a diagram showing the sheet resistance of various heteroepitaxial substrates including the embodiments of the present invention.

FIG. 5 shows the effect of the preheating process on the sheet resistance of the heteroepitaxial substrate. In FIG. 5, the solid circles represent the result in which the preheating process is conducted in an arsine atmosphere, while the open circles represent the result in which the preheating process is conducted in a $H_2$ atmosphere.

Referring to FIG. 5, the results designated as "conventional" indicates the case for a heteroepitaxial substrate having the structure of FIG. 2 except that the layers 22a and 22b are free from Al. In other words, the layers 22a and 22b of the "conventional" heteroepitaxial substrate are formed of GaAs. The heteroepitaxial substrate is formed on the Si substrate 22 after a preheating process conducted at 1000° C., wherein the layers 22a and 22b are deposited consecutively on the Si substrate 22 at the substrate temperatures of 400° C. and 650° C., respectively. Further, the layer 22c is deposited on the layer 22b at a temperature of 700° C. As long as one uses GaAs for the layers 22a and 22b, the sheet resistance of the heteroepitaxial substrate surface never exceeds 1 k$\Omega$/□, not only in the case in which the preheating is conducted in the arsine atmosphere but also in the case in which the preheating is conducted in the $H_2$ atmosphere.

FIG. 5 also shows the result for the heteroepitaxial substrate of the present embodiment described previously in which the layers 22a and 22b both contain Al. It should be noted that the result for the present embodiment is designated in FIG. 5 as "present invention (1)." As will be noted, one can increase the sheet resistance of the heteroepitaxial substrate to the order of 3–4 k$\Omega$/□ by applying the preheating process in the $H_2$ atmosphere. In other words, the present embodiment is extremely effective for enhancing the effect of preheating conducted in the $H_2$ atmosphere.

FIG. 5 further shows the result of sheet resistance measurement for a heteroepitaxial substrate according to a second embodiment of the present invention designated as "present invention (2)," in which the layers 22a and 22b contain not only Al but also oxygen (O). Such an oxygen doping of group III–V compound semiconductor layers is achieved by incorporating organic metal molecules containing therein oxygen at the time of the MOCVD process or by conducting an ion implantation of oxygen. In the second embodiment of the present invention, the deposition of the layers 22a and 22b is conducted by using TBAs (tertiarybuthylarsine) that contains oxygen as a source of As, wherein the oxygen-doped layers 22a and 22b are deposited with respective thicknesses of 15 nm and 0.5 $\mu$m. The layer 22c, on the other hand, is deposited with a thickness of 1.0 $\mu$m.

As will be noted clearly in FIG. 5, the heteroepitaxial substrate of the present embodiment shows a further improved sheet resistance as compared with the first embodiment of the present invention when the preheating process is conducted in the $H_2$ atmosphere. When the preheating is conducted in the arsine atmosphere, however, both of the first and second embodiments of the present invention show an unsatisfactory sheet resistance smaller than 1 k$\Omega$/□.

Summarizing the result of FIG. 5, the problem of mutual doping between the Si substrate and the group III–V compound semiconductor layer thereon is successfully avoided by conducting the preheating process of the Si substrate in the $H_2$ atmosphere. As a result, one can achieve a sheet resistance exceeding 1 k$\Omega$/□, which has been difficult to achieve by the conventional process of the heteroepitaxial substrate. It should be noted that a similar preferable result is obtained also in the first and second embodiments of the present invention, by treating the surface of the Si substrate by a HF solution.

In the description heretofore, it should be noted that the compound semiconductor layers 22a and 22b are not limited to AlGaAs but other materials of the In—Ga—Al—As—P system such as AlGaP, AlGaAsP, InGaAlP, InGaAlAs, InGaAlAsP or a mixed crystal thereof may also be used. In correspondence to this, one may use any arbitrary mixed crystal of the In—Ga—Al—As—P system such as InAs, InP, GaP, AlAs, or AlP for the compound semiconductor layer 22c. Further, one may use phosphine ($PH_3$), various organoarsenic compounds or various organophosphoric compounds for the source of the group V compound. Such organoarsenic compounds include tertiarybuthylarsine (TBAs), trimethylarsenic (TMAs), triethylarsenic (TEAs), diethylarsenic hydride (DEAs), ethylarsine (EAs), and the like. On the other hand, such organophosphoric compounds include tertiarybuthylphosphine (TBP), trimethylphosphorus (TMP), triethylphosphorus (TEP), diethylphosphorus hydride (DEP), and the like.

Figure 6:
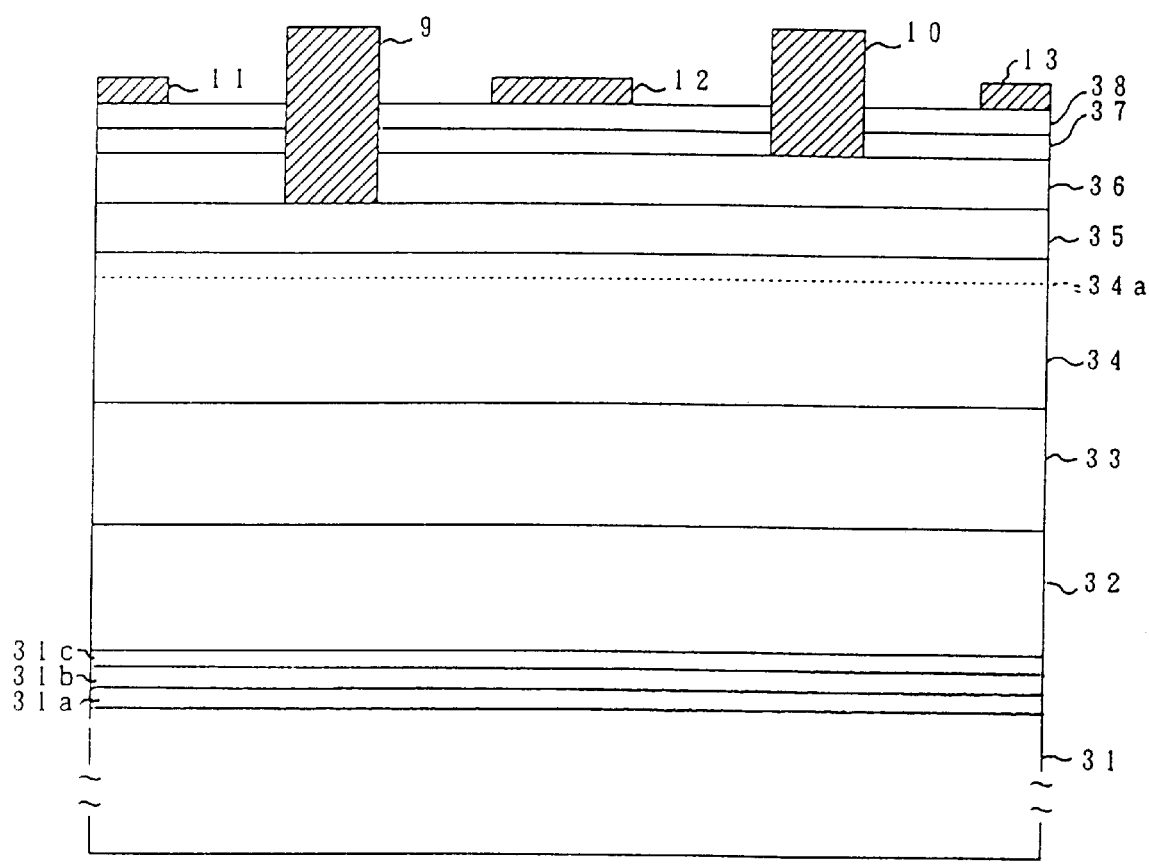
FIG. 6 is a diagram showing the construction of a HEMT according to a third embodiment of the present invention.

FIG. 6 shows the construction of an integrated circuit of HEMT provided on a heteroepitaxial substrate according to a third embodiment of the present invention.

Referring to FIG. 6, the integrated circuit includes a D-mode HEMT and an E-mode HEMT connected in series, wherein the heteroepitaxial substrate includes a Si substrate 31 corresponding to the foregoing Si substrate 22, on which AlGaAs layers 31a and 31b as well as a GaAs layer 31c are deposited consecutively in correspondence to the layers 22a–22c of FIG. 2.

On the layer 31c, a layer 32 of undoped GaAs is formed epitaxially with a thickness of 50 nm as a buffer layer, and a layer 33 of undoped AlGaAs is formed further thereon epitaxially with a thickness of 300 nm as a device isolation layer. On the device isolation layer 33, a layer 34 of undoped GaAs is grown epitaxially with a thickness of 100 nm as an active layer of the device, and a layer 35 of n-type AlGaAs is grown further on the active layer 34 with a thickness of 50 nm as an electron supplying layer. As a result, a two-dimensional electron gas 34a is formed in the active layer 34 along a heteroepitaxial interface between the active layer 34 and the electron supplying layer 35.

On the electron supplying layer 35, a first contact layer 36 of n-type GaAs is formed epitaxially with a thickness of 5 nm, and a second contact layer 37 of n-type AlGaAs is formed thereon epitaxially with a thickness of 5 nm. Further, a cap layer 38 of n-type GaAs is formed on the contact layer 37.

The layers 36–38 are removed selectively in correspondence to the part where the D-mode HEMT is to be formed, by means of a selective etching process that spontaneously stops upon exposure of the electron supplying layer 35, and a Schottky electrode 9 of Al is formed on the exposed surface of the layer 35 as a gate electrode of the D-mode HEMT. Further, the cap layers 37 and 38 are removed in correspondence to the part where the E-mode HEMT is to be formed, and a Schottky electrode 10 of Al is deposited on the exposed surface of the layer 36 as a gate electrode of the E-mode HEMT. Further, ohmic electrodes 11, 12 and 13 are formed on the cap layer 38 wherein the ohmic electrode 11 acts as a source electrode of the D-mode HEMT while the ohmic electrode 13 acts as a drain of the E-mode HEMT. Further, the ohmic electrode 12 acts simultaneously as a drain electrode of the D-mode HEMT and a source electrode of the E-mode HEMT.

As the HEMTs of FIG. 6 are formed on a flat surface provided by the heteroepitaxial substrate of the present invention, the undulation at the heteroepitaxial interface between the active layer 34 and the electron supplying layer 35 is substantially reduced, and the problem of scattering of the electrons in the two-dimensional electron gas is minimized. Thereby, the HEMT shows a performance comparable to the performance of the device formed on a bulk crystal substrate.

Figure 7:
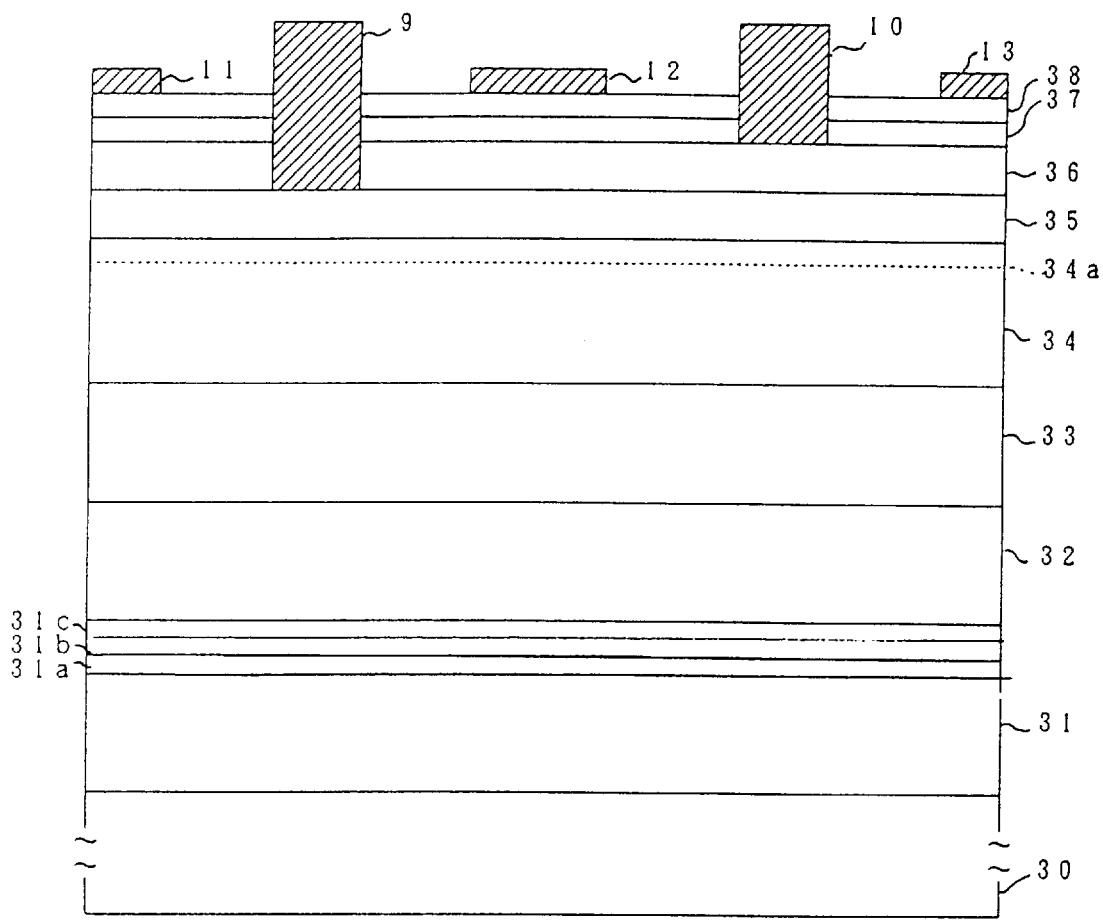
FIG. 7 is a diagram showing a modification of the HEMT of FIG. 6.

FIG. 7 shows a modification of the HEMT of FIG. 6, wherein it will be noted that the Si substrate 31 is now supported on an insulating support substrate 30. In other words, the heteroepitaxial substrate used in the device of FIG. 7 has an SOI structure. By using the heteroepitaxial substrate of the present invention in combination with an insulating substrate, it is possible to fabricate an integrated circuit of compound semiconductor devices with a large integration density while maintaining excellent device isolation. Further, the fabrication cost of the integrated circuit may be reduced.

Next, a fourth embodiment of the present invention will be described with reference to FIG. 8.

In the experiments conducted on the structure of FIG. 2 for measuring the sheet resistance of the Si substrate 22 in the state that the group III–V compound semiconductor layers 22a–22c are removed from the surface of the Si substrate, the inventor has discovered that the sheet resistance of the Si substrate has been reduced from the initial level of 20 k$\Omega$/□ to the level of only 3–4 k$\Omega$/□ after the deposition of the foregoing group III–V compound semiconductor layers. Thereby, it was also confirmed that the surface of the Si substrate 22 thus exposed is doped to the n-type. These findings clearly indicate that there still occurs a diffusion of the group V elements from the compound semiconductor layers to the Si substrate during the deposition process wherein the substrate is heated to the temperature of 650–750° C. On the other hand, it is believed that the group III–V compound semiconductor layers 22a–22c thus deposited on the substrate 22 themselves have a relatively high resistance.

In view of the foregoing discovery, the present inventor conducted an investigation about the relationship between the sheet resistance of the heteroepitaxial substrate obtained in the previous embodiments and the defect density for oxidation-induced stacking faults (OSFs) in the Si substrate used for the substrate 22, and has discovered an interesting relationship.

Figure 8:
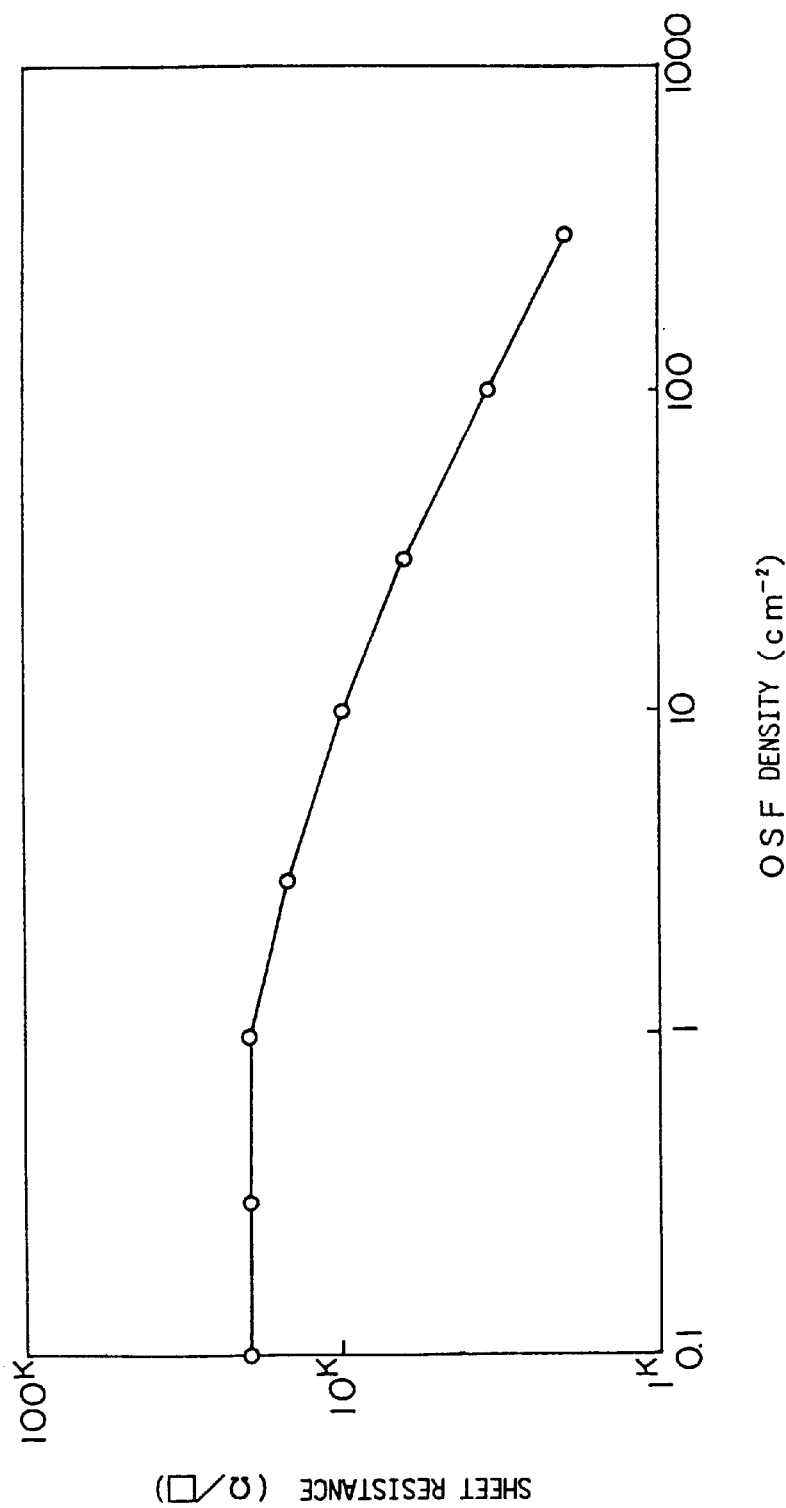
FIG. 8 is a diagram showing the relationship between a sheet resistance and an OSF density of a Si substrate used for the base of a heteroepitaxial substrate according to a fourth embodiment of the present invention.

FIG. 8 shows such a relationship discovered by the inventor, wherein the vertical axis represents the sheet resistance of a heteroepitaxial substrate having the structure of FIG. 2, while the horizontal axis represents the OSF density in the Si substrate 22.

In the experiments, the Si substrate 22 is first subjected to a preheating process conducted in a H$_2$ atmosphere, and the first AlGaAs layer 22a is deposited on the Si substrate 22 thus treated, with a thickness of 10–20 nm at a temperature of 300–400° C., followed by a deposition of the second AlGaAs layer 22b similarly to the first embodiment, wherein the deposition of the second AlGaAs layer 22b is conducted at a temperature of 500–600° C. with a thickness of 200–700 nm. Further, the GaAs layer 22c is deposited on the second AlGaAs layer 22b at a temperature between 650–750° C. with a thickness of 0.5–1.5 μm. The sheet resistance of the heteroepitaxial substrate thus obtained was measured by causing a vortex current to flow therein. A more detailed description for the fabrication process of the heteroepitaxial substrate will be given later.

As will be evident from FIG. 8, the heteroepitaxial substrate thus formed shows a decreased sheet resistance when the OSF density increases. Conversely, the heteroepitaxial substrate shows an increased sheet resistance with a decrease in the OSF density. As the OSF density is considered as being an index indicating the degree of perfectness of the crystal, it is believed that the result of FIG. 8 indicates clearly that one can effectively suppress the diffusion of the group V elements through the defects in the Si substrate 22, by using a Si substrate characterized by a small OSF density. At the present, however, it is not clear whether the OSF itself contributes to the diffusion of the group V elements in the Si substrate 22. It was further found that the Si substrate used for the substrate 22 in the first embodiment has an OSF density of about 100 cm$^{-2}$.

Referring to FIG. 8, it will be noted that one can increase the sheet resistance of the heteroepitaxial substrate to 7.5 k$\Omega$/□ or more by using a Si substrate having an OSF density of 30 cm$^{-2}$ or less. The sheet resistance is further increased above 10 k$\Omega$/□ by using a Si substrate having an OSF density of 10 cm$^{-2}$ or less. When a Si substrate having an OSF density of 3 cm$^{-2}$ or less is used, one can increase the sheet resistance of the heteroepitaxial substrate to the level of 15 k$\Omega$/□ or more. Further, when a Si substrate having an OSF density of 1 cm$^{-2}$ is used, the sheet resistance of the heteroepitaxial substrate increases up to the level of about 20 k$\Omega$/□, wherein it should be noted that the foregoing level of about 20 k$\Omega$/□ corresponds to the original sheet resistance of the Si substrate 22.

In FIG. 8, it is noted that further decrease of the OSF density does not contribute to the effect of reducing the sheet resistance any further, while this is merely due to the fact that the Si substrate used for the substrate 22 has a specific resistance of about 1000 $\Omega$.cm (thickness=500 μm). When a Si substrate having a larger specific resistance is used for the substrate 22, one can increase the sheet resistance of the heteroepitaxial substrate more by reducing the OSF density further, as will become evident from the explanation with regard to the next embodiment.

Hereinafter, a detailed description will be given with regard to the fabrication process of the heteroepitaxial substrate of the present embodiment with reference to FIG. 2.

First, an (100)-oriented substrate of Si having a principal surface inclined in the (011) direction with respect to the (100) surface with an offset angle of 2°, is subjected to a high temperature hydrogen annealing process conducted at 1200° C. in a H$_2$ environment for controlling the OSF density, such that the OSF density of the Si substrate is reduced to the level of 30 cm$^{-2}$ or less. It is well known in the art that one can reduce the OSF density of a Si substrate significantly by conducting a high temperature hydrogen annealing process in which the Si substrate is annealed in a H$_2$ atmosphere at a high temperature such as 1200° C. See, for example, KASHIMA, K., et al., "High-temperature hydrogen-annealed silicon wafer for next-generation ULSI devices," Ouyou-Butsuri, vol.63, no.11, 1994 (in Japanese). The Si substrate used for the present embodiment may have a specific resistance of 1000 $\Omega$.cm or more.

Next, the Si substrate thus treated is held on the susceptor 21 of the deposition apparatus of FIG. 1 as the substrate 22, and the carrier gas of H$_2$ is introduced to the reactor 20 with a flowrate of 10–15 SLM, typically with a flowrate of 12

SLM. While introducing the carrier gas, the reactor 20 is evacuated at the outlet port 20a such that the internal pressure of the reactor 20 is held at 76 Torr, and a preheating process is conducted at a temperature of 900–1100° C., typically at 1000° C., for 10–30 minutes by energizing the RF coil 24. As a result of the pre-heating process, any oxide film is removed from the Si substrate 22.

Next, while maintaining the pressure inside the reactor 20 at 76 Torr, the temperature of the substrate 22 is reduced to 300–400° C., typically to 350° C., and the foregoing source gases are introduced into the reactor 20. More specifically, the source gases of TMA, TEG and arsine are introduced with respective flowrates of 2–3 SCCM, 2–4 SCCM and 120–160 SCCM, typically with respective flowrates of 2.5 SCCM, 3 SCCM and 140 SCCM. As a result, the first layer 22a of AlGaAs is grown on the Si substrate 22 as indicated in FIG. 2 with a thickness of 10–20 nm, typically with a thickness of 15 nm. The layer 22a thus obtained may have a composition of $Al_{0.2}Ga_{0.8}As$ and shows an excellent flat surface due the composition that contains Al and due to the very small layer thickness. As the layer 22a is very thin, one may replace the layer 22a by a thin layer of GaAs.

Next, the supply of TMA and TEG is interrupted and the substrate temperature is raised to 500–600° C., typically to 550° C., while holding the pressure inside the reactor at 76 Torr. After the substrate temperature has reached a desired predetermined temperature, the supply of TMA and TEG is resumed to form the second layer 22b of AlGaAs on the first layer 22a with a thickness of 200–700 nm, typically with a thickness of 500 nm. In this process, TMA, TEG and arsine are supplied with respective flowrates of 0.2–0.3 SCCM, 0.8–1.2 SCCM and 50–70 SCCM. Typically, TMA and TEG are supplied with respective flowrates of 0.25 SCCM and 1.0 SCCM. The layer 22b thus formed typically has a composition of $Al_{0.2}Ga_{0.8}As$.

Conventionally, the second layer 22b thus formed generally shows a rough crystal surface, while the present invention successfully suppresses the formation of rough surface on the layer 22b by incorporating Al into the layer 22b similarly to the first embodiment. Further, the process of interrupting the supply of TMA and TEG during the process of raising the substrate temperature prior to the deposition of the layer 22b, also contributes to the effect of suppressing the formation of rough surface on the layer 22b.

After the formation of the AlGaAs layer 22b as such, the substrate temperature is raised to 650–750° C., typically to 700° C., while holding the pressure inside the reactor at 76 Torr. Further, the source of Ga is switched from TEG to TMG and the layer 22c of GaAs is grown on the AlGaAs layer 22b with a thickness of 0.5–1.5 μm, typically with a thickness of 1.0 μm. During the process of growing the GaAs layer 22c, TMG and arsine are supplied with respective flowrates of 2.0–3.0 SCCM and 30–40 SCCM. Typically, the supply of TMG is made with a flowrate of 2.5 SCCM. In order to suppress the dislocation density on the surface of the layer 22c to a level of $10^8$ $cm^{-2}$ or less as is required for a semiconductor substrate and to prevent cracking of the heteroepitaxial layer, it is preferable to set the overall thickness of the heteroepitaxial layer including the layers 22a–22c to fall in a range of 1–2 μm, typically 1.5 μm.

As noted already, the heteroepitaxial substrate thus formed has a very large sheet resistance. For example, one can increase the sheet resistance of the heteroepitaxial substrate to 7.5 kΩ/□ or more by using a Si substrate having an OSF density of 30 $cm^{-2}$ or less. The sheet resistance is further increased above 10 kΩ/□ by using a Si substrate having an OSF density of 10 $cm^{-2}$ or less. When a Si substrate having an OSF density of 3 $cm^{-2}$ or less is used, one can increase the sheet resistance of the heteroepitaxial substrate to the level of 15 kΩ/□ or more. Further, when a Si substrate having an OSF density of 1 $cm^{-2}$ is used, the sheet resistance of the heteroepitaxial substrate increases up to the level of about 20 kΩ/□, wherein it should be noted that the foregoing level of about 20 kΩ/□ corresponds to the original sheet resistance of the Si substrate 22.

In the foregoing high temperature annealing process of the Si substrate 22, it should be noted that OSF density can be decreased below the level of 1 $cm^{-2}$, by improving the purity of the atmospheric $H_2$.

By forming the first and second compound semiconductor layers 22a and 22b from a material containing Al, it is possible to increase the resistance of the layers 22a and 22b similarly to the previous embodiments. It should be noted that Al has a strong affinity to oxygen and easily reacts with oxygen. Thus, oxygen ions are incorporated into the layers 22a and 22b together with Al, while the oxygen thus incorporated act as a carrier killer and cause a depletion of carriers in the layers 22a and 22b. Further, one may use a metalorganic substance containing oxygen in the molecule such as trimethoxyaluminum for the source of Al when growing the layers 22a and 22b, as already explained with reference to the first embodiment.

It should be noted that, in the present embodiment, too, the material for the layers 22a and 22b is not limited to AlGaAs but any other compositions in the system of In—Ga—Al—As—P such as AlGaP, AlGaAsP, InGaAlP, InGaAlAs, InGaAlAsP or a mixed crystal thereof may be used for the layers 22a and 22b. Associated with this, the compound semiconductor layer 22c is not limited to GaAs as noted before, but any compositions in the In—Ga—Al—As—P system such as InAs, InP, GaP, AlAs, AlP or a mixed crystal thereof may be used.

Further, one may use phosphine ($PH_3$), or organoarsenic or organophosphorous compound for the source of the group V element when depositing the layers 22a–22c. Such an organoarsenic compound includes tertiarybuthylarsine (TBAs), trimethylarsenic (TMAs), triethylarsenic (TEAs), diethylarsenic hydride (DEAs), ethylarsine (EAs), and the like. Further, such an organophosphorous compound includes tertiarybuthylphosphine (TBP), trimethylphosphorus (TMP), triethylphosphorus (TEP), diethylphosphorus hydride (DEP), and the like. Further, the Si substrate 22 may be an SOI substrate.

Next, a fifth embodiment of the present invention will be described with reference to FIGS. 9 and 10, wherein those parts explained already are designated by the same reference numerals and the description thereof will be omitted.

Figure 9:
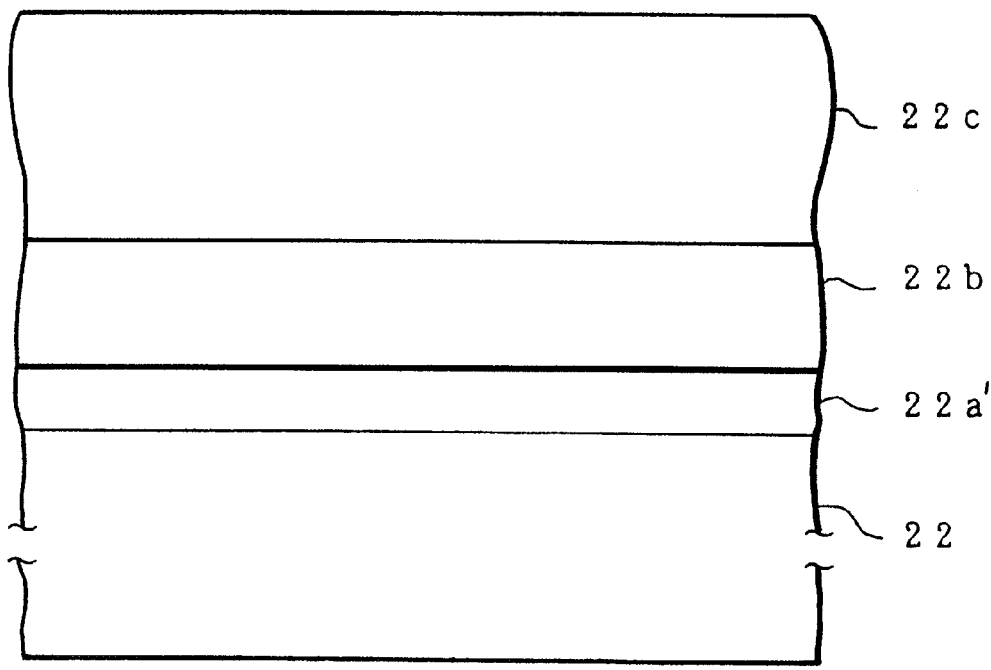
FIG. 9 is a diagram showing the construction of a heteroepitaxial substrate according to a fifth embodiment of the present invention.

In the present embodiment, the inventor has discovered that one can increase the sheet resistance of the heteroepitaxial substrate further, by using a group III–V compound semiconductor material that contains Sb but is substantially free from As and P, for a layer 22a' shown in FIG. 9. In FIG. 9, it should be noted that the layer 22a' replaces the layer 22a of FIG. 2 and that Sb is an element having a characteristically low solubility limit in Si.

In the present embodiment, it should be noted that the deposition of the layer 22a' is made as a result of pyrolytic decomposition of TMA, TEG and TMSb (trimethylantimony). The deposition is made at a temperature of 400–500° C., typically at 450° C. while supplying TMA, TEG and TMSb with respective flowrates of 0.2–0.3 SCCM, 0.8–1.2 SCCM and 15–25 SCCM, typically with the flowrates of 0.25 SCCM, 1.0 SCCM and 20 SCCM. Thereby, the layer 22a' is grown with a thickness of 10–50 nm, typically with a thickness of 25 nm.

Figure 10:
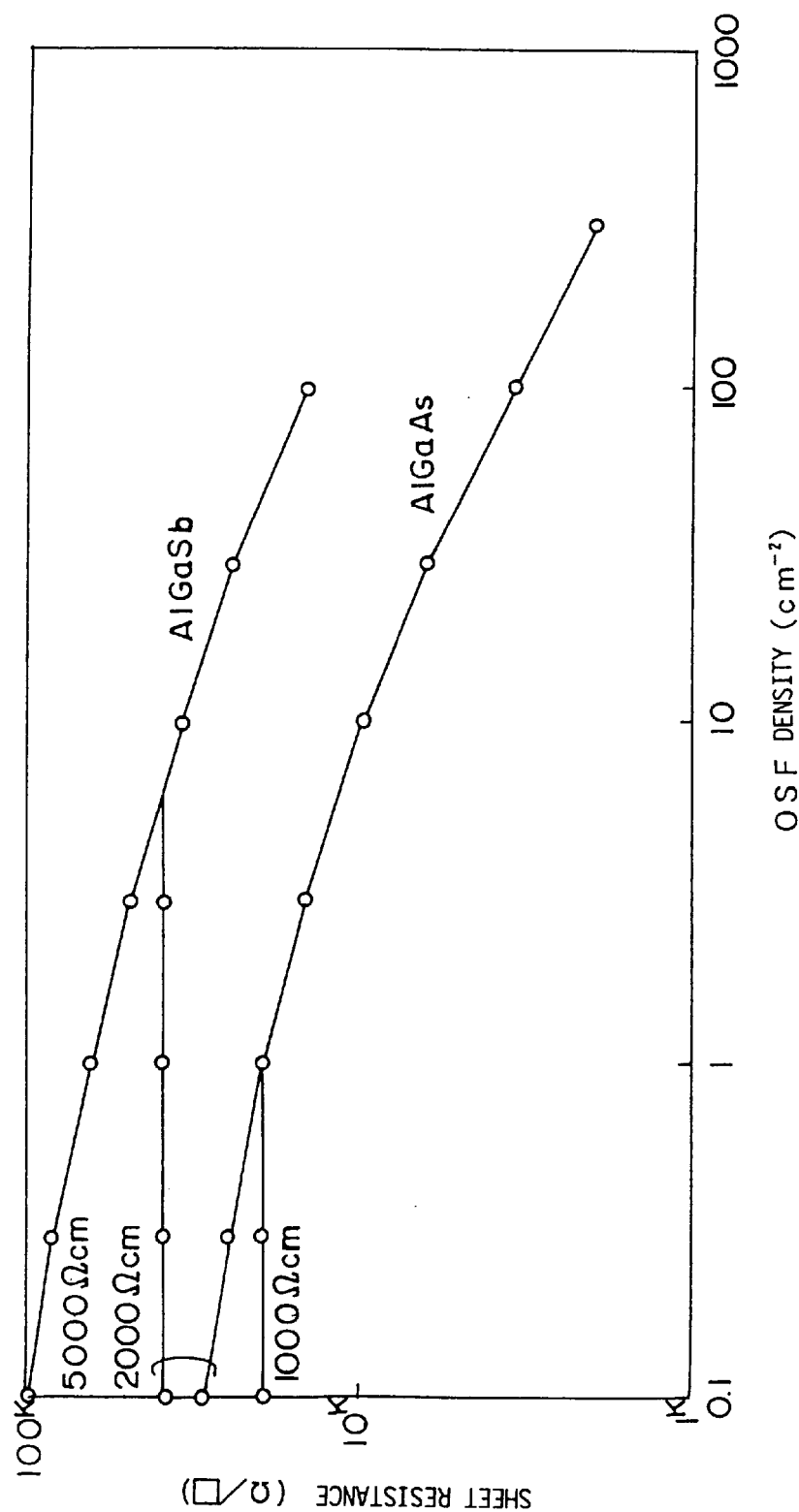
FIG. 10 is a diagram showing the relationship between a sheet resistance and an OSF density of a Si substrate used for the base of the heteroepitaxial substrate of FIG. 9.

FIG. 10 shows the relationship between the sheet resistance of the heteroepitaxial substrate of FIG. 9 and the OSF density in the Si substrate used in the heteroepitaxial substrate of FIG. 9, for various specific resistances of the Si substrate.

Referring to FIG. 10, it will be noted that the relationship of FIG. 8 holds for the case in which the Si substrate 22 has a specific resistance of 1000 Ω.cm. Further, it will be noted that the sheet resistance of the heteroepitaxial substrate of FIG. 2 increases up to about 30 kΩ/□ when the Si substrate 22 has a specific resistance of 2000 Ω.cm and when the OSF density is reduced to 0.1 $cm^{-2}$.

FIG. 10 also indicates that, when AlGaSb is used for the layer 22a' as in the case of the structure of FIG. 9, the sheet resistance of the heteroepitaxial substrate increases significantly as compared with the structure of FIG. 2. Thus, it will be noted that a sheet resistance of 40 kΩ/□ is already realized when the OSF density is reduced to about 6 $cm^{-6}$. While further increase of the sheet resistance does not occur as long as the specific resistance of the Si substrate 22 is about 2000Ω, it will also be noted that a further increase of the sheet resistance, up to the level of 100 kΩ/□, is achievable when a Si substrate having a specific resistance of 5000Ω is used and for the substrate 22 when the OSF density of the substrate 22 is reduced to the level of 0.1 $cm^{-2}$.

The relationship of FIG. 10 clearly indicates that one can minimize the doping of the Si substrate 22 by using a group V element having a small solubility limit in Si for the layer 22a' in the structure of FIG. 9. It should be noted that Sb is a group V element having a characteristically low solubility limit in Si.

It should be noted that the layer 22a' of the structure of FIG. 9 is by no means limited to AlGaSb but may be formed of other group III–V compound semiconductor materials containing Sb as a group V element but substantially free from As and P. Such a compound semiconductor material includes InSb, GaSb, AlSb or a mixed crystal thereof.

By using the heteroepitaxial substrate of FIG. 9 or the heteroepitaxial substrate of the previous embodiment in the structure of FIG. 6 or FIG. 7, one can improve the high frequency operational characteristics of the device further.

Figure 11:
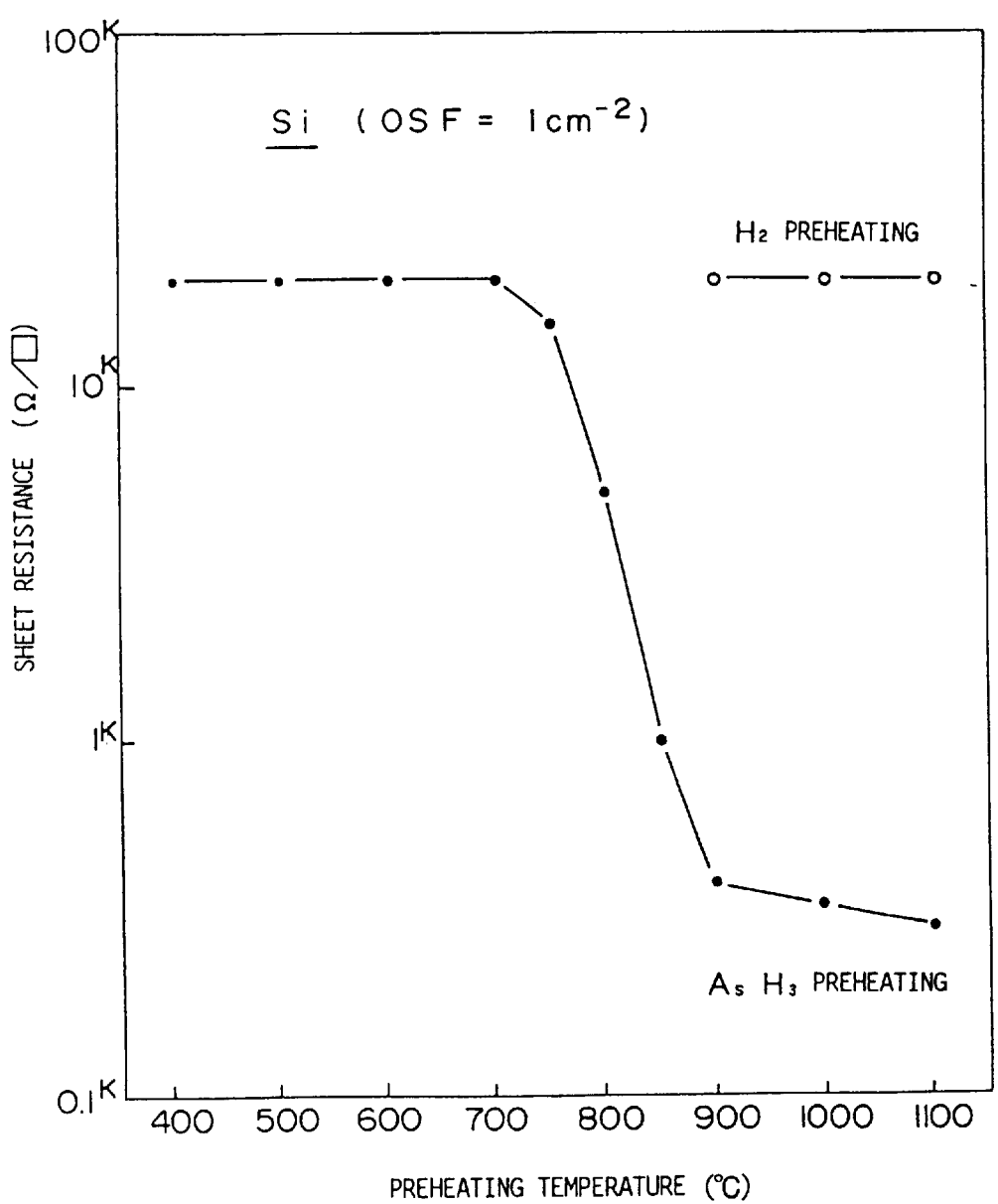
FIG. 11 is a diagram showing the effect of low temperature preheating conducted in a AsH$_3$ atmosphere according to a sixth embodiment of the present invention.

FIG. 11 shows a preheating process of the heteroepitaxial substrate according to a sixth embodiment of the present invention. As the heteroepitaxial substrate itself has a structure identical to the structure of FIG. 2 or FIG. 9, further illustration thereof will be omitted.

As already noted, the Si substrate 22 is subjected to a preheating process before the deposition of the layers 22a–22c, wherein it was discovered that the problem of sharp drop of the sheet resistance of the heteroepitaxial substrate associated with the deposition of the layers 22a–22c can be successfully eliminated even when the preheating process is conducted in the $AsH_3$ atmosphere, provided that the preheating is conducted at a temperature below 700° C. See the relationship of FIG. 11, which clearly indicates that the high sheet resistance of about 20 kΩ/□ is maintained for the heteroepitaxial substrate as long as the preheating is made at a temperature below about 700° C. When conducting a preheating process at such a low temperature, it is necessary to remove the oxide film from the surface of the Si substrate by a wet etching process.

Further, FIG. 11 indicates that heteroepitaxial substrate maintains high sheet resistance even when the preheating process is made at a temperature exceeding 700° C. such as 1100° C., as long as the preheating is made in a $H_2$ atmosphere, in conformity with the result of FIG. 5.

Further, the present invention is not limited to the embodiments described heretofore, but various variations and modifications may be made without departing from the scope of the invention.

What is claimed is:

1. A compound semiconductor device, comprising:

a Si substrate;

a first group III–V compound semiconductor layer provided on said Si substrate, said first group III–V compound semiconductor layer having a thickness set to enable a direct deposition of said first group III–V compound semiconductor layer on a surface of said Si substrate, said Si substrate containing oxidation-induced stacking faults with a density sufficient for suppressing a diffusion of a group V element in said first group III–V compound semiconductor layer into said Si substrate;

a second group III–V compound semiconductor layer provided on said first group III–V compound semiconductor layer, said second group III–V compound semiconductor layer containing Al and having a thickness that minimizes a surface roughness thereof;

a third group III–V compound semiconductor layer provided on said second group III–V compound semiconductor layer;

a fourth group III–V compound semiconductor layer provided on said third group III–V compound semiconductor layer; and an active device formed on said fourth group III–V compound semiconductor layer.

2. A compound semiconductor device as claimed in claim 1, wherein said second group III–V compound semiconductor layer has a thickness of about 500 nm.

3. A compound semiconductor device as claimed in claim 1, wherein said third group III–V compound semiconductor layer has a root mean square of surface roughness of 4.0 nm or less.

4. A compound semiconductor device as claimed in claim 1, wherein said Si substrate has a resistivity of 1000 Ω.cm or more.

5. A compound semiconductor device as claimed in claim 1 further comprising an insulating support substrate such that said support substrate carries thereon said Si substrate.

6. A compound semiconductor device as claimed in claim 1, wherein each of said first and second group III–V compound semiconductor layers contains oxygen therein.

7. A compound semiconductor device as claimed in claim 1, wherein said Si substrate contains oxidation-induced stacking faults with a density equal to or smaller than 30 $cm^{-2}$.

8. A compound semiconductor device as claimed in claim 1, wherein said Si substrate contains oxidation-induced stacking faults with a density equal to or smaller than 10 $cm^{-2}$.

9. A compound semiconductor device as claimed in claim 1, wherein said Si substrate contains oxidation-induced stacking faults with a density equal to or smaller than 3 $cm^{-3}$.

10. A compound semiconductor device as claimed in claim 1, wherein said Si substrate contains oxidation-induced stacking faults with a density equal to or smaller than 1 $cm^{-2}$.

11. A compound semiconductor device as claimed in claim 1, wherein said first group III–V compound semiconductor layer contains Sb as a group V element and wherein said first group III–V compound semiconductor layer is substantially free from As and P.

12. A compound semiconductor device as claimed in claim 11, wherein said first group III–V compound semiconductor layer has a composition selected from a group consisting of InSb, GaSb, AlSb and a mixed crystal thereof.

* * * * *

UNITED STATES PATENT AND TRADEMARK OFFICE
CERTIFICATE OF CORRECTION

PATENT NO. : 6,188,090 B1
DATED : February 13, 2001
INVENTOR(S) : Shinji Miyagaki et al.

It is certified that error appears in the above-identified patent and that said Letters Patent is hereby corrected as shown below:

<u>Title page,</u>
Item (56) References Cited, change "5,844,360" to -- 5,844,260 --.

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*